(12) United States Patent
Liou

(10) Patent No.: US 6,620,678 B2
(45) Date of Patent: Sep. 16, 2003

(54) INTEGRATED CIRCUIT DEVICE FORMED WITH HIGH Q MIM CAPACITOR

(75) Inventor: Ping Liou, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/252,678

(22) Filed: Sep. 23, 2002

(65) Prior Publication Data

US 2003/0025144 A1 Feb. 6, 2003

Related U.S. Application Data

(62) Division of application No. 09/994,398, filed on Nov. 26, 2001, now Pat. No. 6,459,117.

(30) Foreign Application Priority Data

Aug. 3, 2001 (TW) ......................................... 90119041 A

(51) Int. Cl.[7] ......................................... H01L 21/8242
(52) U.S. Cl. ..................... 438/244; 438/253; 438/387
(58) Field of Search ......................... 438/244, 253, 438/387, 396, 957, 648, 656, 683, 685, 622

(56) References Cited

U.S. PATENT DOCUMENTS

| | | | | |
|---|---|---|---|---|
| 5,864,153 A | | 1/1999 | Nagel et al. | 257/296 |
| 6,022,774 A | * | 2/2000 | Kawai et al. | 438/240 |
| 6,046,469 A | | 4/2000 | Yamazaki et al. | 257/306 |
| 6,184,551 B1 | * | 2/2001 | Lee et al. | 257/310 |
| 6,200,629 B1 | * | 3/2001 | Sun | 427/79 |
| 6,294,834 B1 | * | 9/2001 | Yeh et al. | 257/758 |
| 6,342,734 B1 | * | 1/2002 | Allman et al. | 257/758 |
| 6,384,442 B1 | * | 5/2002 | Chen | 257/298 |
| 6,459,117 B1 | | 10/2002 | Liou | 257/306 |

* cited by examiner

Primary Examiner—Phat X. Cao
Assistant Examiner—Theresa T. Doan
(74) Attorney, Agent, or Firm—Pate Pierce & Baird

(57) ABSTRACT

An integrated circuit device with high Q MIM capacitor and its forming process are disclosed. The MIM capacitor dielectric layer is formed of a material which has relatively high dielectric constant and can be used as an anti-reflection coating (ARC). In the process of patterning MIM capacitor electrodes, the MIM capacitor dielectric layer can be directly used as an anti-reflection layer. Therefore, there is no need to form an anti-reflection layer on the metal layer, and the complexity and the cost of forming process can decrease.

19 Claims, 3 Drawing Sheets

INTEGRATED CIRCUIT DEVICE FORMED WITH HIGH Q MIM CAPACITOR

RELATED APPLICATIONS

This application is a division of U.S. application Ser. No. 09/994,398, filed Nov. 26, 2001, now U.S. Pat. No. 6,459,117, and entitled "INTEGRATED CIRCUIT DEVICE FORMED WITH HIGH Q MIM CAPACITOR", which is hereby incorporated herein by reference.

FIELD OF THE INVENTION

This invention relates to an integrated circuits, and more particularly to an integrated circuit device with high quality factor (Q) metal-insulator-metal (MIM) capacitor and its forming process.

BACKGROUND OF THE INVENTION

In current very large scale integration (VLSI) such as dynamic random access memory (DRAM), the capacitor is used as a storage element to store digital data. Writing digital data is performed by the steps of charging and discharging the capacitor. In current VLSI technology, double polysilicon capacitor (DPC) are widely used as the capacitor of VLSI.

Nowadays most digital and analog circuits are manufactured with VLSI technology, only the application of radio frequency (RF) is still not performed by VLSI technology. From 1990, the applications of radio frequency are developed gradually. They are applied to personal communications, radio communications, satellite communications, and radio peripheral equipment of computers. These applications are performed by monolithic microwave integrated circuit (MMIC) technology.

In MMIC design, the capacitor is made of metal-insulator-metal (MIM) such that the capacitor has higher capacitance. The MIM capacitor includes two metal conducting plates and a dielectric layer for separating the two metal conducting plates.

However, most capacitors are conventionally made by using polysilicon layers as upper and lower electrodes. For high frequency and RF applications, the electrodes made of polysilicon layers would result in a poor Q due to high resistivity of polysilicon material.

Therefore, the present invention provides a process for forming an integrated circuit device with high Q MIM capacitor.

SUMMARY OF THE INVENTION

It is an object of the present invention to provide an integrated circuit device with high Q MIM capacitor, wherein the material of dielectric layer of MIM capacitor is an anti-reflection coating (ARC).

It is another object of the present invention to provide a process for forming an integrated circuit device with high Q MIM capacitor.

In accordance with an aspect of the present invention, the integrated circuit device includes a semiconductor device, a first dielectric layer, a first barrier layer, a capacitor, an inter-metal dielectric layer, and a metal layer. The semiconductor device has plural semiconductor elements. The first dielectric layer is formed on the semiconductor device. The first barrier layer is formed on a portion of the first dielectric layer. The capacitor is formed on the first barrier layer and has a lower electrode, a capacitor dielectric layer, and an upper electrode, wherein the capacitor dielectric layer is made of anti-reflection coating (ARC) with relatively high dielectric constant. The inter-metal dielectric layer is formed on the capacitor and the first dielectric layer. The metal layer is formed on the inter-metal dielectric layer and used as conductive wires.

The semiconductor device includes a semiconductor substrate and a field oxide layer formed on the semiconductor substrate for defining an active area and an isolated area of the semiconductor substrate to isolate each of the semiconductor elements.

Preferably, the material of the semiconductor substrate is silicon or galium arsenide.

Preferably, the material of the first dielectric layer is borophosphosilicate glass (BPSG), the material of the first barrier layer is titanium nitride (TiN), the thickness of the first barrier layer is ranged from 200–1000 angstrom, the material of the lower electrode tungsten or aluminum, and the thickness of the lower electrode is ranged from 5000–10000 angstrom.

Preferably, the anti-reflection coating (ARC) is silicon-oxy-nitride (SiOxNy).

Preferably, the thickness of the capacitor dielectric layer is less than 10 nanometer, the material of the upper electrode is aluminum, and the material of the inter-metal dielectric layer is borophosphosilicate glass (BPSG) or silicon dioxide.

The integrated circuit device further includes plural plugs formed in the inter-metal dielectric layer for connecting the metal layer with one of the upper electrode and the lower electrode, respectively.

Preferably, the plural plugs are made of tungsten.

The integrated circuit device further includes a second barrier layer formed between portions of the inter-metal dielectric layer and the metal layer.

Preferably, the material of the second barrier layer is titanium nitride (TiN).

Preferably, the material of the metal layer is aluminum.

In accordance with another aspect of the present invention, the process for forming an integrated circuit device includes steps of forming a first barrier layer, forming a first metal layer, forming a second dielectric layer, forming a second metal layer, forming an upper electrode, forming a lower electrode, forming an inter-metal dielectric layer, forming plural plugs, forming a second barrier layer, forming a third metal layer, and removing a portion of the third metal layer and the second barrier layer thereby exposing a portion of the inter-metal dielectric layer. The first barrier layer is formed on a semiconductor device. The first metal layer is formed on the first barrier layer. The second dielectric layer is formed on the first metal layer and made of anti-reflection coating (ARC) with relatively high dielectric constant. The second metal layer is formed on the second dielectric layer. The upper electrode is formed by removing a portion of the second metal layer and the second dielectric layer thereby exposing a portion of the first metal layer. The lower electrode is formed by removing a portion of the first metal layer and the first barrier layer thereby exposing a portion of the semiconductor device. The inter-metal dielectric layer is formed on the upper electrode, the lower electrode and the semiconductor device. The plural plugs are formed in the inter-metal dielectric layer for connecting a third metal layer with the upper electrode or the lower electrode. The second barrier layer is formed on the inter-metal dielectric layer. The third metal layer is formed on the second barrier layer.

The semiconductor device is formed by the steps of providing a semiconductor substrate, forming a field oxide layer on the semiconductor substrate to define an active area and an isolated area of the semiconductor substrate, and forming a first dielectric layer on the field oxide layer and the semiconductor substrate.

Preferably, the first dielectric layer is formed by chemical vapor deposition (CVD) and then planarization process.

Preferably, the planarization process is performed by spin-on glass with back etch process or chemical mechanical polishing (CMP) process.

Preferably, the first barrier layer is formed by sputtering.

Preferably, the first metal layer is formed by chemical vapor deposition (CVD) process or sputtering.

The step of forming the upper electrode is performed by using a first photomask to pattern and etch the second metal layer and the second dielectric layer.

Preferably, the step of etching the second metal layer and the second dielectric layer is performed by dry etch.

Preferably, the dry etch is a reactive ion etch (RIE).

The step of forming the lower electrode is performed by using a second photomask to pattern and etch the first metal layer and the first barrier layer.

Preferably, the step of etching the first metal layer and the first barrier layer is performed by dry etch.

Preferably, the dry etch is a reactive ion etch (RIE).

Preferably, the inter-metal dielectric layer is formed by chemical vapor deposition (CVD) or plasma-enhanced chemical vapor deposition (PECVD).

The plural plugs are formed by the steps of patterning the inter-metal dielectric layer by photolithography process to define a pattern connecting the third metal layer with the upper electrode or the lower electrode, forming plural via holes in the inter-metal dielectric layer according to the pattern, and filing the plural via holes with a metal material.

Preferably, the step of forming the plural via holes is performed by dry etch.

Preferably, the dry etch is a reactive ion etch (RIE).

Preferably, the metal material is tungsten.

Preferably, the third metal layer is formed by sputtering.

The step of removing a portion of the third metal layer and the second barrier layer thereby exposing a portion of the inter-metal dielectric layer is performed by using a fourth photomask to pattern and etch the third metal layer and the second barrier layer.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1A:
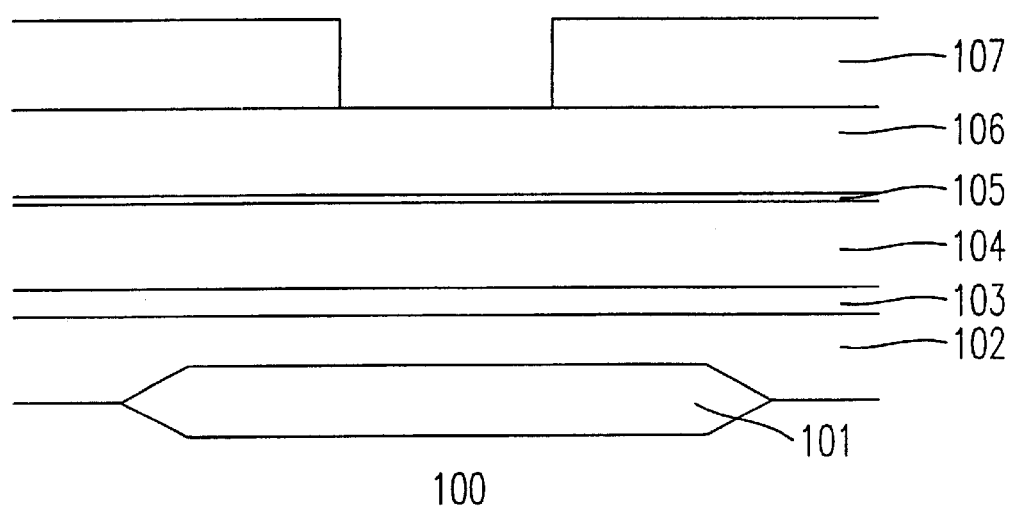
FIGS. 1A~1F are cross-sectional views illustrating the steps of forming an integrated circuit device with high Q MIM capacitor according to a preferred embodiment of the present invention.

Please refer to FIG. 1A. A field oxide (FOX) layer 101 is formed on a semiconductor substrate 100 to define an active area and an isolated area of the semiconductor substrate 100. The semiconductor substrate 100 is made of silicon or galium arsenide. An integrated circuit device such as a transistor includes a source, a drain, and a gate formed in the active area of the semiconductor substrate 100. A first dielectric layer 102 is then formed on the field oxide layer 101 and the semiconductor substrate 100. The first dielectric layer 102 is an inter-layer dielectrics made of an insulator material. It can be formed of borophosphosilicate (BPSG) by chemical vapor deposition (CVD) for providing an insulator between the semiconductor substrate 100 and the conducting layer formed on the first dielectric layer 102.

After the first dielectric layer 102 is formed, it is then planarized by a spin-on glass with back etch process or a chemical mechanical polishing (CMP) process. Subsequently, a first barrier layer (or glue layer) 103 with a thickness ranged from 200–1000 angstrom is formed on the first dielectric layer 102 by sputtering. Preferably, the first barrier layer 103 is made of titanium nitride (TiN) by sputtering.

After the first barrier layer 103 is formed, a first metal layer 104 made of tungsten (W) or aluminum (Al) is formed thereon. The thickness of the first metal layer 104 is ranged from 5000–10000 angstrom. The first metal layer 104 can be made of tungsten (W) by CVD or aluminum (Al) by sputtering.

After the first metal layer 104 is formed, a second dielectric layer 105 with a thickness less than 10 nanometer is formed thereon. Particularly, the material of the second dielectric layer 105 is not only with high dielectric constant but also used as an anti-reflection coating (ARC) for improving in pattern transfer of subsequent photolithography process.

For patterning the surface of metal or semiconductor device in VLSI process, a photoresist layer is usually coated on the surface of metal or semiconductor device. Then the pattern of photomask can be developed on the photoresist layer by exposure. But when metal or semiconductor device is exposed to light source, the lightwave transmitted the photoresist layer will reflect and form a standing wave, which makes errors in pattern transfer and thus reduces yield. The errors will be more serious especially when the photoresist is coated on a surface with high reflectivity such as metal. Therefore, in the prior art, an anti-reflection coating (ARC) such as titanium nitride (TiN) is used to form an anti-reflection layer for avoiding errors in pattern transfer.

Unfortunately, TiN is not suitable as dielectrics because the dielectric constant of TiN is not high. In MIM capacitor process, a TiN layer is formed as an anti-reflection layer after a dielectric layer is formed to avoid errors in subsequent photolithography process, which increases fabricating cost. It is found that oxysininitride (SiOxNy) has higher dielectric constant than that of silicon dioxide, and thus it can be used as either dielectric or anti-reflection coating (ARC). If the second dielectric layer 105 is made of inorganic SiOxNy and its thickness, refractive index and extinguish coefficient are well defined, it can provide a good control of critical dimension swing curve and eliminate the generation of standing wave in exposure. In a preferred embodiment of the present invention, the second dielectric layer 105 is made of inorganic antireflective SiOxNy. But other inorganic or organic anti-reflective materials with high dielectric constant can also be applied to form the second dielectric layer 105.

Figure 1B:
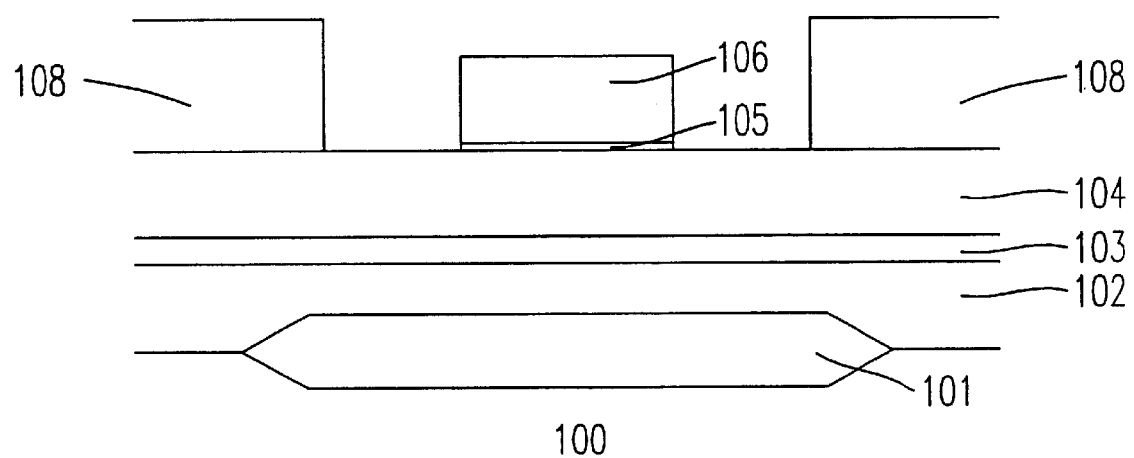

A second metal layer 106 such as an aluminum layer is formed on the second dielectric layer 105 by sputtering. Then a photoresist layer is formed on the second metal layer 106, and patterned according to a first photomask 107 which contains a window thereby exposing a portion of the second metal layer 106. The second metal layer 106 and the second dielectric layer 105 are then proceeded by dry etch such as reactive ion etch (RIE) which uses the photoresist pattern 107 as an etching mask. The patterned metal layer 106 is used as an upper electrode as shown in FIG. 1B.

Figure 1C:
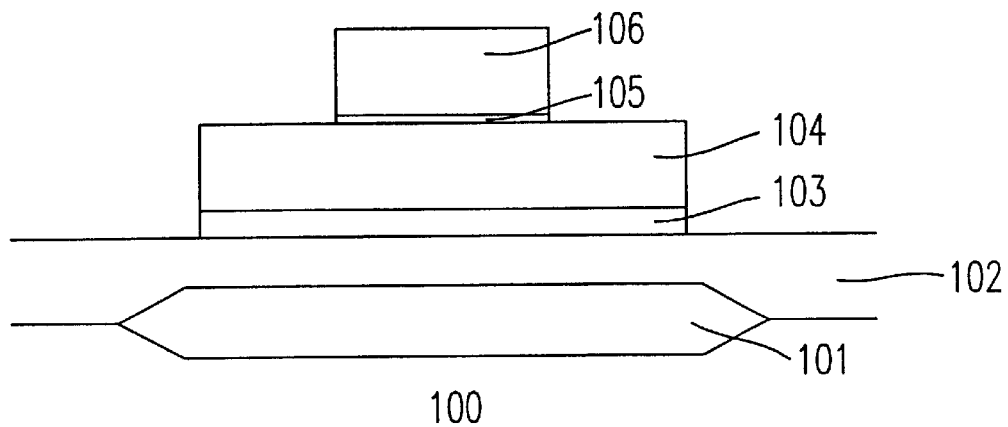

A photoresist layer is formed on the upper electrode 106 and the first metal layer 104, and patterned according to a second photomask 108. The first metal layer 104 and the first barrier layer 103 are then proceeded by dry etch such as RIE which uses the photoresist pattern 108 as an etching mask. The patterned metal layer 104 is used as a lower electrode as shown in FIG. 1C.

Figure 1D:
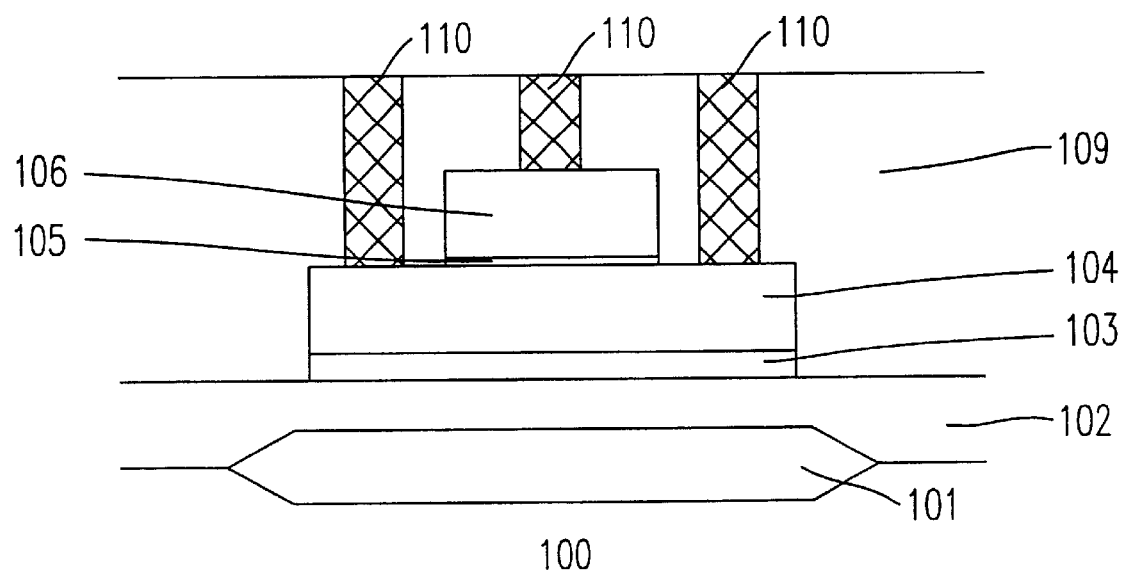

An inter-metal dielectric layer 109, which is made of BPSG by CVD or silicon dioxide by plasma-enhanced CVD (PECVD), is formed on the upper electrode 106, the lower electrode 104 and the first dielectric layer 102, for isolating the upper electrode 106, the lower electrode 104 and subsequently formed metal layer. A connecting pattern, which is defined as the connecting positions of the upper electrode 106, the lower electrode 104 and subsequently formed metal layer, is transferred by photolithography to a photoresist layer coated on the inter-metal dielectric layer according to a third photomask (not shown). Then the inter-metal dielectric layer 109 which is not protected by the photoresist is removed by dry etch to form plural via holes 110 for connecting subsequently formed metal layer with the upper electrode 106 or the lower electrode 104. Subsequently, plural tungsten plugs are formed by tungsten plug deposition with etch back process in the via holes 110 as shown in FIG. 1D.

Figure 1E:
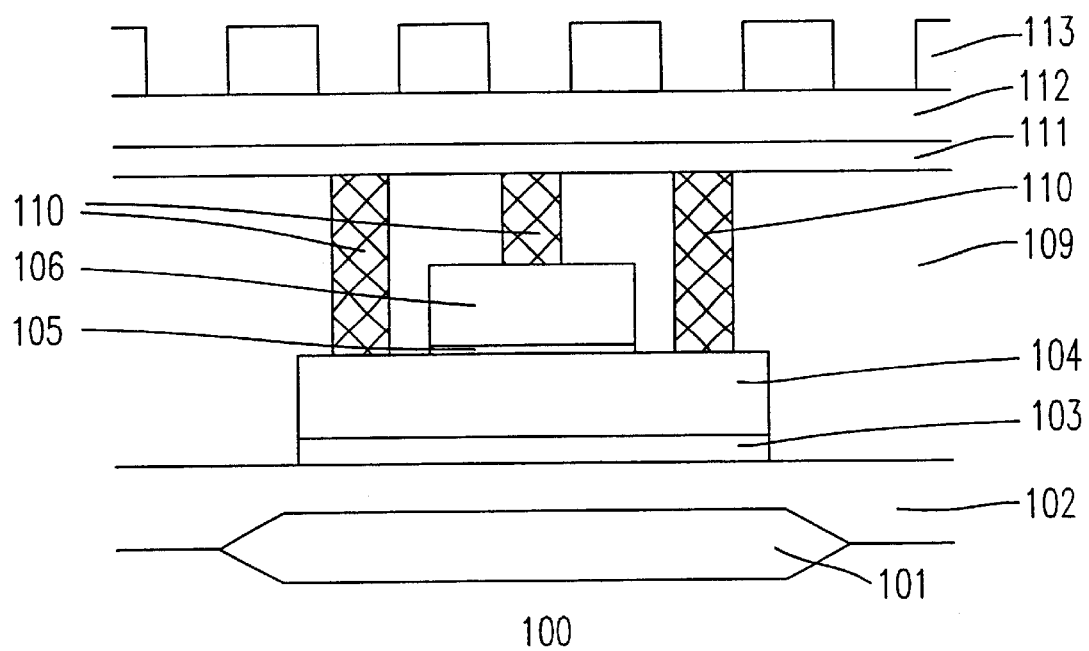
Figure 1F:
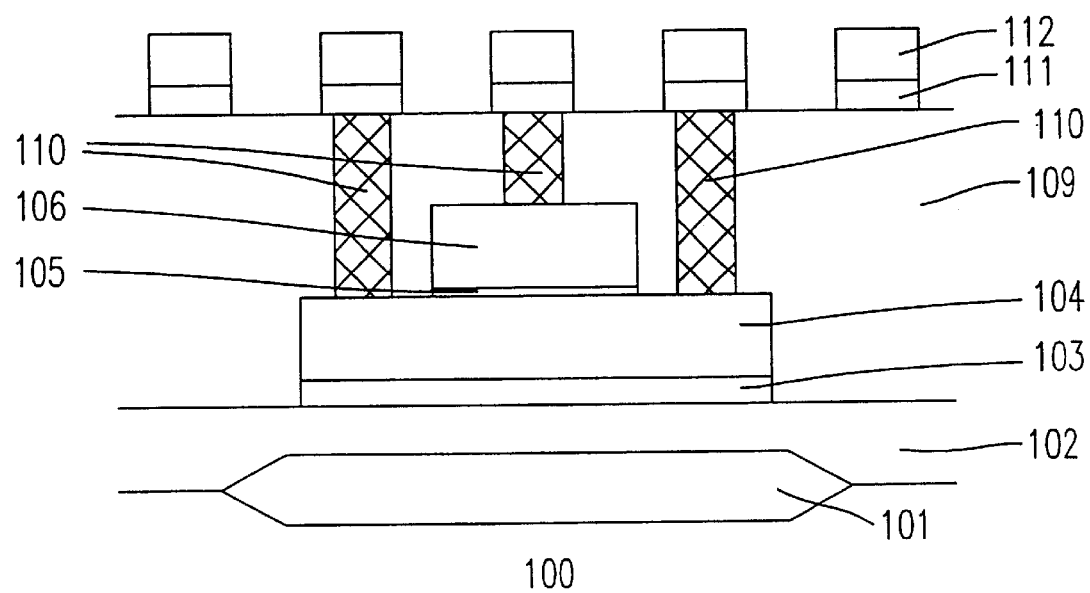

After the tungsten plugs are formed, a second barrier layer 111 is formed on the inter-metal dielectric layer 109 for avoiding direct contact between tungsten and subsequent formed metal layer. The second barrier layer 111 is preferably made of TiN by sputtering, just as the first barrier layer 103. A third metal layer 112 is preferably made of aluminum by sputtering on the second barrier layer 111 as shown in FIG. 1E. Then a photoresist layer is formed on the third metal layer 112, and patterned according to a fourth photomask 113 which contains plural windows thereby exposing a portion of the third metal layer 112. The third metal layer 112 and the second barrier layer 111 are then proceeded by dry etch such as RIE which uses the photoresist pattern 113 as an etching mask. A cross-sectional view of the formed integrated circuit device is shown in FIG. 1F. The patterned metal layer 112 will be proceeded a wiring process. The formed integrated circuit device includes a thin film capacitor composed of the lower electrode 104, the second dielectric layer 105 and the upper electrode 106, which can provide high Q and more stable capacitance.

In conclusion, the characteristic of the integrated circuit device with high Q MIM capacitor of the present invention is to use metal such as aluminum or tungsten for forming the upper and lower electrodes, and use anti-reflection coating (ARC) with high dielectric constant such as SiOxNy for forming the dielectric layer of MIM capacitor. Because the chosen dielectric can be used as an anti-reflection coating (ARC), the step of forming an anti-reflection layer on a metal layer can be omitted, and the complexity and the cost of forming process are also decreased. By the way, a high Q MIM capacitor is formed by using metal to replace polysilicon of prior art MIM capacitor as upper and lower electrodes. Thus the present invention overcomes the disadvantage of poor Q in the traditional MIM capacitor and also lowers the complexity and the cost of forming process. Therefore, the present invention exhibits industrial application and high commercial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for forming an integrated circuit device, comprising steps of:

forming a first barrier layer on a semiconductor device;

forming a first metal layer on said first barrier layer;

forming a second dielectric layer of anti-reflection coating (ARC) with relatively high dielectric constant on said first metal layer;

forming a second metal layer on said second dielectric layer;

forming an upper electrode by removing a portion of said second metal layer and said second dielectric layer thereby exposing a portion of said first metal layer;

forming a lower electrode by removing a portion of said first metal layer and said first barrier layer thereby exposing a portion of said semiconductor device;

forming an inter-metal dielectric layer on said upper electrode, said lower electrode and said semiconductor device;

forming plural plugs in said inter-metal dielectric layer to connect said plural plugs with one of said upper electrode and said lower electrode, respectively;

forming a second barrier layer on said inter-metal dielectric layer;

forming a third metal layer on said second barrier layer, said third metal layer connects to the plural plugs; and removing a portion of said third metal layer and said second barrier layer thereby exposing a portion of said inter-metal dielectric layer.

2. The process according to claim 1, wherein said semiconductor device is formed by the steps of:

providing a semiconductor substrate;

forming a field oxide layer on said semiconductor substrate to define an active area and an isolated area of said semiconductor substrate; and forming a first dielectric layer on said field oxide layer and said semiconductor substrate.

3. The process according to claim 2, wherein said first dielectric layer is formed by chemical vapor deposition (CVD) and then planarization process.

4. The process according to claim 3, wherein said planarization process is performed by one of spin-on glass with back etch process and chemical mechanical polishing (CMP) process.

5. The process according to claim 1, wherein said first barrier layer is formed by sputtering.

6. The process according to claim 1, wherein said first metal layer is formed by one of chemical vapor deposition (CVD) process and sputtering.

7. The process according to claim 1, wherein said step of forming said upper electrode is performed by using a first photomask to pattern and etch said second metal layer and said second dielectric layer.

8. The process according to claim 7, wherein said step of etching said second metal layer and said second dielectric layer is performed by dry etch.

9. The process according to claim 8, wherein said dry etch is a reactive ion etch (RIE).

10. The process according to claim 1, wherein said step of forming said lower electrode is performed by using a second photomask to pattern and etch said first metal layer and said first barrier layer.

11. The process according to claim 10, wherein said step of etching said first metal layer and said first barrier layer is performed by dry etch.

12. The process according to claim 11, wherein said dry etch is a reactive ion etch (RIE).

13. The process according to claim 1, wherein said inter-metal dielectric layer is formed by one of chemical vapor deposition (CVD) and plasma-enhanced chemical vapor deposition (PECVD).

14. The process according to claim 1, wherein said plural plugs are formed by the steps of:

patterning said inter-metal dielectric layer by photolithography process to define a pattern connecting said third metal layer with one of said upper electrode and said lower electrode, respectively;

forming plural via holes in said inter-metal dielectric layer according to said pattern; and filing said plural via holes with a metal material.

15. The process according to claim 14, wherein said step of forming said plural via holes is performed by dry etch.

16. The process according to claim 15, wherein said dry etch is a reactive ion etch (RIE).

17. The process according to claim 14, wherein said metal material is tungsten.

18. The process according to claim 1, wherein said third metal layer is formed by sputtering.

19. The process according to claim 1, wherein said step of removing a portion of said third metal layer and said second barrier layer thereby exposing a portion of said inter-metal dielectric layer is performed by using a fourth photomask to pattern and etch said third metal layer and said second barrier layer.

* * * * *